United States Patent [19]

Endrös et al.

[11] Patent Number: 5,702,538
[45] Date of Patent: Dec. 30, 1997

US005702538A

[54] SILICON SEMICONDUCTOR WAFER SOLAR CELL AND PROCESS FOR PRODUCING SAID WAFER

[75] Inventors: Arthur Endrös, München, Germany; Giuliano Martinelli, Ferrara, Italy

[73] Assignee: Siemens Solar GmbH, Munich, Germany

[21] Appl. No.: 656,348

[22] PCT Filed: Dec. 14, 1994

[86] PCT No.: PCT/DE94/01489

§ 371 Date: Jun. 14, 1996

§ 102(e) Date: Jun. 14, 1996

[87] PCT Pub. No.: WO95/17016

PCT Pub. Date: Jun. 22, 1995

[30] Foreign Application Priority Data

Dec. 17, 1993 [DE] Germany .................. 43 43 296.4

[51] Int. Cl.$^6$ .................. H01L 31/04; H01L 31/0368; H01L 31/18
[52] U.S. Cl. .................. 136/258; 117/1; 117/13; 117/35; 117/902; 257/64; 437/4
[58] Field of Search .................. 136/258 PC; 257/64; 117/1, 13, 35, 902; 437/4

[56] References Cited

U.S. PATENT DOCUMENTS 5,579,388  11/1996  Endroes et al. .................. 379/433

OTHER PUBLICATIONS

G. Martinelli, *Solid State Phenomena*, vol. 32–33 (Aug. 1993), pp. 21–26.

Applied Physics Letters, vol. 62, No. 25, 21 Jun. 1993, G. Martinelli et al, "Growth Of Stable Dislocation–Free 3–Grain Silicon Ingots For Thinner Slicing," pp. 3262–3263.

23rd IEEE Photovoltaic Specialists Conference, 10 May 1993, D.S. Ruby et al, "Simplified Process For 23% Efficient Silicon Concentrator Solar Cells," pp. 172–177.

10th E.C. Photovoltaic Solar Energy Conference, 8 Apr. 1991, M.A. Green et al, "Recent Advances In Silicon Solar Cell Performance,"M.A. Green et al, pp. 250–253.

Journal of the Electrochemical Society, vol. 110, No. 1, Jan. 1993, H.J. Queisser, "Properties Of Twin Boundaries in Silicon", pp. 52–56.

Solar Cells, vol. 31, No. 3, Jun. 1991, D. Palmeri et al, "A Reverse Silicon Solar Cell", pp. 217–222.

12th European Photovoltaic Solar Energy Conference, 11 Apr. 1994, A. Benati et al, "Evaluation of Very Thin Crystalline Silicon Solar Cells For Large Scale Application", pp. 1804–1806.

*Primary Examiner*—Aaron Weisstuch
*Attorney, Agent, or Firm*—Hill, Stedman & Simpson

[57] ABSTRACT

A silicon semiconductor wafer is constructed from three mutually inclined monocrystalline regions (6, 7, 8) which form three circular sectors of the wafer whose interfaces and boundary lines consequently extend radially with respect to one another and form angles (W6, W7, W8) of less than 180° with one another. In this arrangement, two of the interfaces are first-order twin grain boundaries between two <111> crystal planes in each case. The silicon semiconductor wafer is used to produce inexpensive high-performance solar cells.

11 Claims, 2 Drawing Sheets

SILICON SEMICONDUCTOR WAFER SOLAR CELL AND PROCESS FOR PRODUCING SAID WAFER

BACKGROUND OF THE INVENTION

For the photovoltaic generation of energy in the power range, highly efficient, inexpensive, large-area solar cells with long-term stability are necessary which are composed of environmentally compatible materials which are adequately available. These requirements are not fulfilled simultaneously at present by any solar-cell type. Monocrystalline silicon solar cells (c—Si) which already fulfill all the other requirements except inexpensiveness come closest to the requirements at present.

The achievement of high efficiencies (>20%) requires, in addition to a good surface passivation (surface recombination rate Sr<100 cm/s for the rear side and Sf<1000 cm/s for the front side or emitter side), the use of silicon crystals whose diffusion length L of the minority charge carriers is about three times greater than the thickness d of the initial wafer used. However, for reasons of mechanical robustness, the <100>-oriented c—Si wafers used at present still require a thickness of over 300 µm. The diffusion lengths of approximately 900 µm necessary for 20% efficiency can therefore be achieved only by the use of high-purity, low-oxygen and low-carbon crystals which are consequently very expensive.

The optimum physical thickness of c—Si solar cells is, however, not the 300 µm used at present, but between 60 µm and 90 µm. This is due to the fact that, on the one hand, the open-circuit voltage Voc of solar cells rises with decreasing thickness d, while, on the other hand, only a silicon layer thickness of approximately 100 µm is sufficient to absorb the usable sunlight (AM1.5) completely and convert it into current. In addition, a cell thickness d of about 60 µm–90 µm necessitates a substantially lower material requirement. As a result of the lower requirements imposed on the diffusion length (180 µm–270 µm), the requirements imposed on the material quality would also be lower, so that inexpensive crucible-pulled material (Cz—Si) could also be used as starting material for highly efficient silicon solar cells.

SUMMARY OF THE INVENTION

The Si monocrystals at present chiefly used as starting material are <100>-oriented and can be processed to form 60 µm–90 µm thick solar cells only with very high sawing and yield losses. An economical production is therefore not possible on this basis.

One solution route for arriving at sufficiently thin, but fracture-resistant absorbers has been taken with polycrystalline silicon thin-layer solar cells on foreign substrates. The inexpensiveness, large-area producibility and productive capacity of this process have not yet, however, been demonstrated.

The object of the present invention is to provide a solar cell made of crystalline silicon, which has, in a cost- and material-saving way, a high efficiency of 20 percent and over.

In general terms, the present invention is a solar cell constructed on a mechanically robust 60 to 90 µm thick silicon semiconductor wafer as a substrate. It has three mutually inclined monocrystalline regions which form three circular sectors whose interfaces and boundary lines extend radially with respect to one another and form angles of less than 180° with one another. Two of the interfaces are first-order twin grain boundaries between two <111> crystal planes in each case. A light p-doping is in the wafer with a shallow, n+-doped emitter 0.2–2 µm deep on a front side on the wafer and a first passivation layer on the front side of the wafer.

A second passivation layer or a back surface field is on the rear side of the wafer. Current-collecting contacts are on the front and rear sides.

Advantageous developments of the present invention are as follows.

The solar cell is produced from crucible-drawn silicon (Cz—Si), with an efficiency of more than 20 percent.

The interfaces are approximately perpendicular to the plane of the wafer and form the angles W6, W7, and W8 with respect to one another, where:

W7=W8=(360°−W6)/2 and W6=109.47°±2°.

The surfaces of the three monocrystalline regions are <110> crystal planes.

The solar cell has a texturing on the front side in the form of cones etched into the semiconductor surface.

The first passivation layer on the front side is an oxide layer which produces a charge carrier recombination rate Sf on the surface of less than 1000 cm/s.

The charge carrier recombination rate Sr on the rear side is less than 100 cm/s.

The present invention is also a process for producing a silicon semiconductor wafer for a solar cell substrate having three mutually inclined circular-sector-shaped monocrystalline regions. Three octahedral seed crystals are produced by sawing them out of a conventional <110>-oriented monocrystal such that all the octahedral surfaces are identical with <111> crystal planes. Two of the seed crystals are joined by laying them on top of one another and fixing them with a wire so that a first-order twin grain boundary is formed. Using the two joined seed crystals, a bicrystal is grown by means of a crystal growing process. A wedge-shaped piece is sawn out of the bicrystal and in this process a <111> plane of the two half-crystals is laid bare in each case. The third seed crystal is inserted into the wedge-shaped gap such that it forms a second first-order twin grain boundary with the <111> crystal surface. The bicrystal is shortened to approximately the length of the third seed crystal to form a tricrystal seed. A tricrystal ingot is pulled from a silicon melt by means of a crystal growing process using the tricrystal seed. Semiconductor wafers are sawn out of the tricrystal ingot using a wire saw.

Advantageous developments of this embodiment of the present invention are as follows.

A molybdenum wire is used to fix the seed crystals.

A Czochralski process is used for crystal growing.

The tricrystal seed and the growing tricrystal ingot are aligned such that six mirror-like facets form on the tricrystal ingot.

After pulling a first tricrystal ingot from a quartz melting crucible, the silicon melt which is not more than half consumed is topped up by adding fresh silicon and the entire process is repeated up to ten times.

The sawn-off tip of a previously pulled tricrystal ingot is used as a seed crystal.

To solve the problem, therefore, a tricrystal is proposed which, with identical electronic properties, has a substantially increased mechanical robustness compared with conventional monocrystals, so that self-supporting silicon semiconductor wafers according to the invention (tricrystal wafers) having a thickness of 60 µm–90 µm can still be sawn with a very high yield of over 95% and further processed to form solar cells. Of comparably thin conventional monocrystal wafers, not a single one survived the manufacturing process.

The basic advantage of the tricrystal according to the invention or of the silicon semiconductor wafer produced therefrom is that a crystal structure is grown which contains no <111>-planes which run obliquely through the crystal and along which a silicon crystal normally first undergoes dislocation and then breaks during the crystal pulling. The interfaces of the monocrystalline regions form angles of less than 180° with one another so that a straight continuous fracture formation is virtually not possible and fracture formation along the angled interfaces is made difficult.

This is achieved by producing a crystal structure in which the <111>-planes represent envelopes of the crystal and consequently extend exactly perpendicularly to the surface of the silicon semiconductor wafer. If tensile forces now occur along the surface which are perpendicular to a <111>-plane, no components of said force are produced parallel to the <111>-planes in this arrangement, with the result that dislocation formation and a subsequent fracture are suppressed. If, on the other hand, tensile forces occur which are parallel to a <111>-plane, the dislocation movement in the tricrystal is suppressed as a result of the fact that the tricrystal wafers do not contain any common continuous <111>-planes due to the tilting of the monocrystalline regions. A dislocation movement and fracture is blocked by the angled interfaces.

The tricrystal described is disclosed in an article by G. Martinelli and R. Kibizov in Appl. Phys. Lett. 62 (25), 21 Jun. 1993, pages 3262 to 3263. In the article, the posssibility is described of manufacturing wafers with a thickness of less than 200 µm from the tricrystal and using them for photovoltaic applications.

Compared with the growing of monocrystals, the pulling of such a tricrystal has cost, quality, and speed advantages which are of great importance for photovoltaic generation:

i.) With constant material quality, a tricrystal can be grown more rapidly by a factor of 2-3 than a <100>-monocrystal.

ii.) Without having to pull a cone tapering to a point, a tricrystal can be pulled directly from the melt in Cz pulling. Because of the special geometry, no dislocations run back into the material in this case as in the pulling of conventional monocrystal ingots (material and time saving).

iii.) Because of the better mechanical robustness compared with monocrystals, the cooling time of tricrystals can be reduced from 3 hours to 1 hour without the ingot undergoing dislocation or shattering (time saving).

iv.) A repeat pulling of a plurality of ingots from the residual melt remaining in each case is possible only about twice in the case of a monocrystal because of dislocation formation as a result of incorporation of impurities—in the case of tricrystals, pulling can be carried out about ten times as a result of the high resistance to dislocation. As a result, a quartz crucible can be used repeatedly if the consumed silicon material of the melt is supplied again (multiple usage of the crucible, time saving).

v.) As a result of the possibility of pulling the crystal from the melt (ii.), of cooling the crystal rapidly (iii.) and of using a plurality of crucible charges (iv.), a rapid and quasi-continuous growth can be achieved. This makes possible, in particular in the case of short tricrystal ingots, a very good uniformity of the crystal properties over the ingot length since the melt is always removed by pulling only down to the same (small) portion.

Fresh silicon is replenished in a quasi-continuous process when the silicon melt in the melting crucible has been consumed up to a maximum of one-half.

Because of the very good mechanical strength, tricrystal ingots can be sawn using commercial wire saws with maximum yields to the optimum thickness for Si solar cells of 60–90 µm. These wafers are mechanically very robust and can be processed further to form solar cells.

To produce solar cells having efficiencies of >20% on the basis of a 60 µm–90 µm thick tricrystal wafer, a diffusion length L of the minority charge carriers of about 180 µm–270 µm is necessary. These values are achievable today even with inexpensive, crucible-pulled silicon (for example Cz silicon), with the result that a high-performance cell can also be produced with inexpensive material. For this purpose, a p-type tricrystal wafer (1–10 ohm*cm, L>180 µm) is provided with a 0.2–2 µm deep emitter on one side by driving in phosphorus. The surface concentration of phosphorus is in this case in the region of approximately $0.8–5 \times 10^{19}$ cm$^{-3}$.

In order to prevent the recombination of minority charge carriers at the surfaces, the front side and the rear side of the solar cell have to be passivated. For efficiencies of over 20%, a passivation of the front side for recombination rates of Sf<1000 cm/s is necessary, while the rear side must be passivated to Sr<100 cm/s. To passivate the front side, an oxide can be used which protects the surface exposed to light. An antireflection layer composed, for example, of silicon nitride can avoid reflection losses and improve the efficiency of the solar cell further. The rear side can be passivated either by a "back-surface field" which is produced by driving in boron or by applying an oxide.

Since a complete collection of all the light-generated minority charge carriers can already be achieved even with inexpensive starting material as a result of the optimum thickness of the surface-passivated tricrystal wafers, the type of construction used for the solar cell plays only a subordinate role if the shading and reflection losses are kept less than 8% and a fill factor of 80% is achieved. Such geometries have been proposed and already produced, for example, by R. A. Sinton, P. Verlinden, D. E. Kane and R. M. Swanson in Proc. of the 8th EC-PV-Solar Energy Coference, Florence, 1988, Kluwer Academic Publishers, pages 1472 ff. and by M. A. Green in Proc. of the 10th EC-PV-Energy Conference, Lisbon, 1991, Kluwer Academic Publishers, pages 250 ff.

The solar cell is contacted either by screen printing a silver paste through a mask with subsequent baking-in or by vapor deposition of Ti/Pd/Ag on the front side or of Al on the rear side of the cell.

Because of their crystal orientation, the tricrystal wafers cannot be textured with a texturing etc. Instead, use is made here of a standard coating of the solar cell front side by applying titanium oxide. Alternatively, the solar cell front side can be textured with inverted cones in an inexpensive and rapid process. For this purpose, a resist which is resistant to silicon etchants is applied to the front side of the wafer, exposed to light in accordance with a regular hole pattern and developed. The silicon surfaces laid bare in the hole pattern are finally etched with an oxidizing acidic etching solution or a basic etching solution, in which process a hole pattern of inverted cones is produced in the wafer surface.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
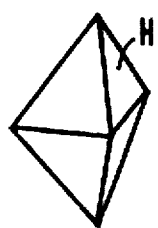
FIGS. 1 to 6 show, in a diagrammatic representation, various process steps in the production of a tricrystal ingot.
Figure 5:
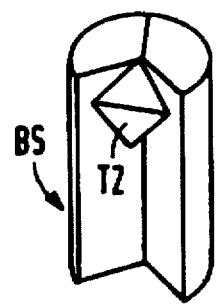
Figure 2:
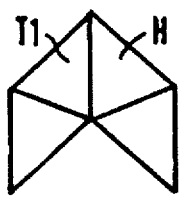
Figure 3:
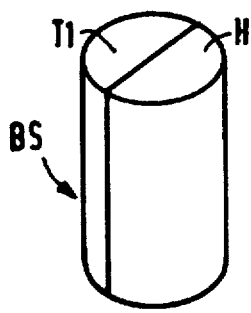
Figure 4:
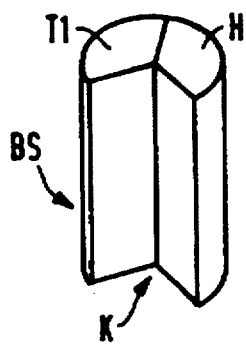

Production of the seed crystal for tricrystal growing:

Referring to FIG. 1:

a) A conventionally produced and, for example, Cz-pulled, <110>-oriented monocrystal is sawn with a diamond annular saw located in a goniometer with an accuracy of 2° in such a way that an octahedron H having eight <111>-oriented surfaces is formed.

b) Step a) is repeated twice in order to produce a total of three octahedrons which are intended to form the seed crystals (H, T1, T2) for the tricrystal.

c) Two of the octahedrons H, T1 from a) and b) are bound together with a molybdenum wire so that the first seed crystal (H) is joined to the second seed crystal (T1) in such a way that a first-order twin grain boundary is formed. It is also possible to fix the seed crystals H, T1 to one another using other means, provided the material of the fixing agent is inert with respect to the silicon melt and has a higher melting point than the latter. A tungsten wire, for example, would therefore also be suitable. FIG. 2 shows the bicrystal seed BK produced in this way in plan view.

d) From the bicrystal seed BK, a bicrystal ingot BS having a diameter of about 10 cm and a length of 10 cm is now grown by means of the Cz or floating zone process (FZ) (see FIG. 3).

e) A wedge K is removed from the bicrystal ingot BS by means of a goniometer and a diamond saw in order to provide room for the third seed crystal T2. For this purpose saw cuts are made along the 112 and the <114> direction (see FIG. 4) and a <111>-crystal plane is laid bare in each of the two monocrystalline regions (H, T1).

f) The third seed crystal T2 is now inserted with Mo wire in such a way that it again forms a first-order twin grain boundary together with the seed crystal H and with the crystal region grown therefrom (see FIG. 5).

g) The bicrystal ingot BS is now sawn back to the length of the third seed crystal T2. A tricrystal seed is obtained.

h) With the aid of the tricrystal seed from g), a thin tricrystal ingot about 20 cm long which is no wider than 1 in$^2$ in cross section is now drawn by the Cz or FZ process.

Growth of tricrystals:

i) The thin tricrystal ingot from h) is used as seed crystal for tricrystal growing. In this connection, it is critical that, on the one hand, the seed crystal is oriented in such a way that the "seam" of the three crystallites is oriented perpendicularly. On the other hand, a check has to be made at the beginning of growth to see whether the six mirror-like facets which are evidence of the production of the tricrystal are situated at the peripheries of the growing crystal ingot. If said facets do not appear, the growth must be started again.

In the crystal pulling process, the tricrystal grows at a rate which is approximately 2–3 times greater than the growth rate of conventional silicon monocrystal ingots.

This is attributable to the increased number of 6 "growth surfaces" of the tricrystal.

As in the case of conventional monocrystals, the cross section of the tricrystal ingot depends on the pulling rate and can be adjusted to a desired value of approximately 6–8".

The tricrystal is pulled to any desired length which, without time or process disadvantages, can be chosen as substantially shorter than in the case of the conventional pulling of monocrystals. In an advantageous way, the crystal ingot length is made dependent on the size of the silicon melting crucible used or vice versa. In order to avoid too sharp an increase in impurities with growing length of the crystal ingot, pulling is carried out until the silicon melt in the melting crucible, which is conventionally composed of quartz, has decreased by a third.

k) After successful growing, the tricrystal 3 is rapidly pulled out of the melt 4 and is allowed to stand for a few minutes about 2 cm above it so that a temperature equilibrium can be established. This process produces a dislocation-free tricrystal (in this connection, see also FIG. 6).

Figure 6:
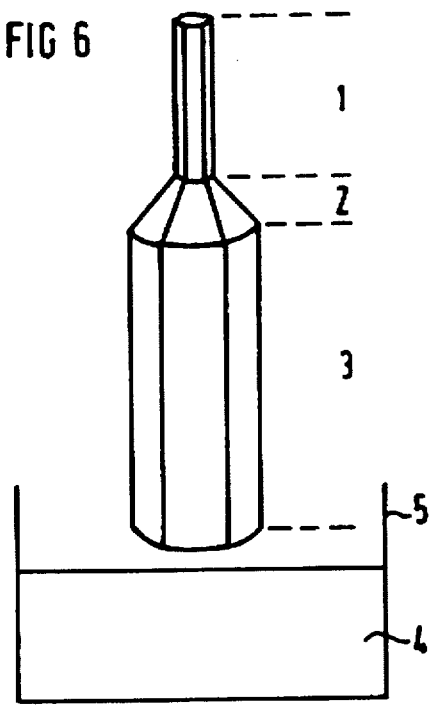

FIG. 6 shows the pulled tricrystal in a diagrammatic representation during the cooling phase. The tricrystal has an upper region 1, which corresponds to the thin tricrystal ingot produced in process step h). In the central region 2, the tricrystal ingot grows rapidly to the desired diameter. This can take place substantially more rapidly than in the case of conventional monocrystal ingots since no <111> crystal planes extend through the crystal transversely to the pulling direction, along which planes dislocations may preferentially occur.

In the lower region 3, the tricrystal ingot already has the desired cross section. Three of the 6 facets are indicated which form in a readily recognizable manner between the cut edges of the perpendicularly situated <111> crystal planes. A substantial difference in the tricrystal ingot compared with monocrystal ingots is, furthermore, that the ingot terminates in a straight fashion at the lower end since it can be rapidly pulled out of the melt 4. In the case of monocrystal ingots, on the other hand, a cone still has to be produced which is later discarded again and therefore requires additional time and expense.

Quasi-continuous tricrystal growth:

l) After step k), the tricrystal is pulled right up in order to be cooled to room temperature within about one hour in a protective gas atmosphere. The cooling time of only one hour (compared with 3 hours otherwise necessary) also results in a further time and cost advantage since, even with this high cooling rate, no stresses arise in the tricrystal ingot which could result in crack formation or other damage to the crystal ingot.

m) The hot quartz crucible 5, only about ⅓ (capacity about 30 kg) emptied by pulling, is refilled with about 10 kg of silicon. After about one hour, the silicon has melted and, during this time, the crystal ingot from l) has also cooled.

n) The thin seed crystal 1 is cut from the crystal ingot 3 and reused in step i).

Since the crucible is only about 33% emptied by pulling, the crystal quality remains very homogeneous over the length in relation to the C, O, B, and P content of the tricrystal ingot.

Using the process according to the invention, up to approximately 10 tricrystal ingots can be pulled from one and the same crucible 5 without the crystal having to be emptied in the meantime or even having to be discarded, as is necessary in the case of monocrystal ingots.

The quality of the 10th tricrystal ingot is then also still adequate to be able to produce therefrom wafers for solar cells having high efficiency.

Using conventional wire saws, in particular using multi-wire saws, wafers of the desired thickness d are now sawn out of the tricrystal ingot produced in this way. It emerges that the wafers can be handled effortlessly even with a thickness of only 60 μm without unduly high fracture risk.

Using a conventional wire saw having a wire diameter of 300 μm and therefore a material loss of 300 μm per saw cut, the sawing of a 60 μm thick wafer out of the tricrystal ingot requires an ingot length of 360 μm. A monocrystalline wafer which can be handled only with a thickness of approximately 330 μm requires, on the other hand, an ingot length of 630 μm. Even this yields a material saving of approximately 40% with the thin tricrystal wafer.

Experiments have shown that the tricrystal ingot according to the invention can also be sawn with thinner wires, with the result that the cut losses can be reduced further. With wires down to 80 μm thick, a material saving can be achieved in this connection of up to 75%. This results in material costs per wafer which are reduced by a factor of 4.

Figure 7:
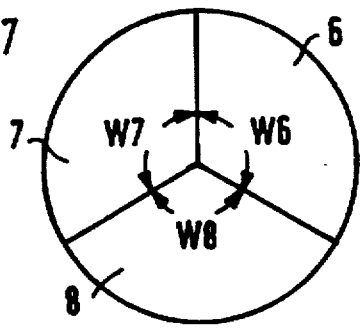
FIG. 7 shows a silicon semiconductor wafer according to the invention in plan view and FIGS. 8 to 10 show the silicon semiconductor wafer in a diagrammatic cross section through various process steps in the further processing to form a solar cell.

FIG. 7 shows one of the silicon semiconductor wafers or tricrystal wafers according to the invention. The three monocrystalline regions 6, 7, and 8, which originate from the three seed crystals H, T1, and T2, are of circular sector shape and form with one another or with respect to one another the angles W6, W7 and W8. If the octahedrons H, T1, and T2 used as seed crystals were sawn out exactly along the <111>-planes, and if the tricrystal ingot was pulled exactly vertically with six regular facets and the wafers were sawn out perpendicularly to the ingot axis, the angle W6 is exactly 109.47°. Given uniform growth, the two other angles W7 and W8 are then exactly the same size and therefore amount to 125.26°. Under the specified growth and sawing conditions, all the three monocrystalline regions 6, 7, and 8 in the wafer have a <110>-surface or, to be precise, a <110> (6), a <0> (7), or a <0>-surface (8). It is, of course, also possible to saw out the wafers with the saw cuts not set vertically with respect to the ingot axis, in which case the wafer surface can be formed from other crystal planes and is correspondingly ellipsoidally shaped.

It was found that maintaining four boundary conditions is sufficient to produce a solar cell having an efficiency of 20%. As already mentioned, these are the diffusion length L of the minority charge carriers and the recombination rates Sf and Sr of the front side and rear side, respectively. In addition, when the front contacts and the front-side coating or passivation are applied, care has to be taken that the shading and reflection losses remain below 8%, which is already achieved with conventional processes. To maintain the first conditions L>3d where d=wafer thickness, diffusion lengths of L>210 μm are necessary for layer thicknesses of d=60 to 70 μm with the tricrystal wafers according to the invention. This material quality can be provided with conventional Czochralski-pulled standard silicon material (Cz—Si). In the case of monocrystalline wafers with d=300 μm, L>900 μm must be fulfilled. This quality is obtained only with a silicon material which is obtained from a floating zone process (FZ—Si). In this connection, the price of FZ—Si is greater than that of Cz—Si by more than an order of magnitude. The boundary conditions Sf<1000 cm/s and Sr<100 cm/s can be achieved with conventional surface coatings. For this purpose, the front side can be passivated with an oxide. For the rear side, it is possible either also to use a passivation oxide or to produce a back-surface field by doping with boron.

A further boundary condition, which is, however, largely dependent on the boundary conditions already mentioned, relates to the fill factor FF, which should not be below 80%. This is also achievable with known and tried processes.

Since alkaline texturing etching is not possible with the tricrystal wafers according to the invention because of their different crystal geometry, a surface coating matched thereto is proposed, according to the invention, to improve the light incident geometry. For this purpose, a hole pattern of inverted cones is etched into the wafer surface by means of a photoresist mask corresponding to this pattern.

Figure 8:
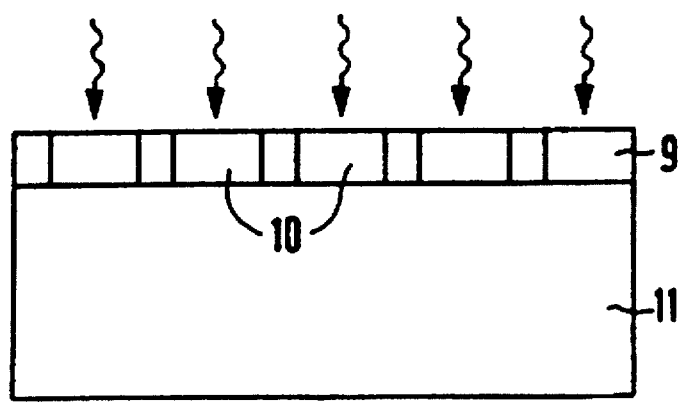

Referring now to FIG. 8: A surface-wide protective layer is produced by surface-wide screen printing of a photosensitive and, for example, positive-working and printable polymer 9 onto the front side of the tricrystal wafer 11 and baking out the polymer 9 at 150° C. for approximately 10 s.

The polymer layer 9 is illuminated with UV light through a hole mask with a given grid of holes each having a diameter of approximately 3–5 μm in order to effect an increased solubility of the polymer in the irradiated regions 10 of the polymer 9 by photochemically producing polar groups.

Figure 9:
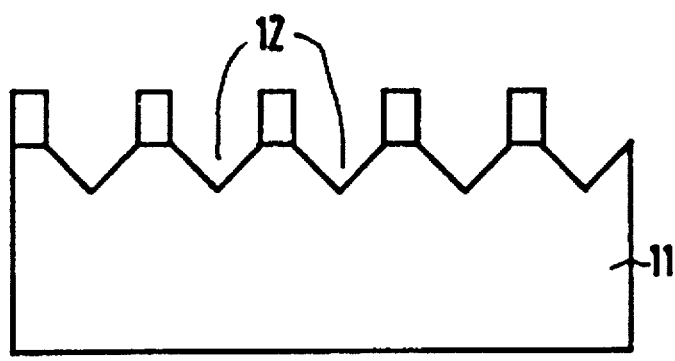

With reference to FIG. 9, the exposed polymer layer 9 can now be removed by wet-chemical etching, for example with a mixture of nitric, hydrofluoric, and acetic acid. An etch removal of the silicon situated thereunder now begins simultaneously at these unprotected points 10. After approximately 10 seconds, inverted cones 12, which serve as light traps, form in the silicon surface.

The wafer 11 surface, now provided with inverted cones (depressions), is laid bare again by stripping the photoresist layer 9 with acetone or other solvents.

A further structural variant which is especially tailored for the tricrystal wafers according to the invention or the high-performance solar cells produced therefrom relates to the arrangement of the front contacts.

Figure 10:
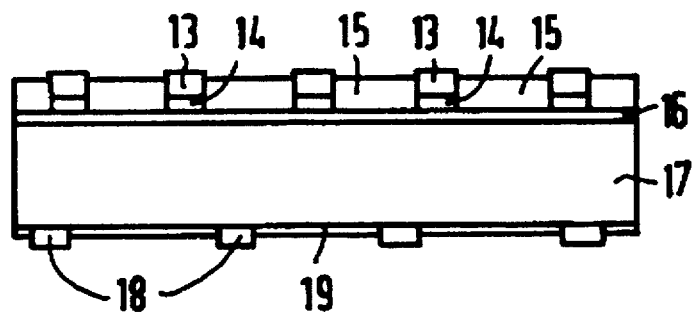

Referring now to FIG. 10: It is proposed to apply the front contacts 13 to mesa-like n++-doped semiconductor structures raised above the remaining wafer surface, while the remaining surface of the front side is formed by the n+-doped emitter 16. To produce this structure, for example, the emitter can be made deeper than usual by driving in phosphorus, for example to a depth of 1 μm. In a further doping step, a shallow n++-type doping, for example 0.4–0.8 μm deep, is driven into the wafer surface in a surface-wide manner. A photoresist procedure can be used to define the mesa structures 14, etching being carried out with the aid of a photoresist mask and the n++-doped region being etched out with the exception of the mesa structures 14 covered with the photoresist mask. The front contact 13 is then applied over the mesa structures 14. It is also possible to apply the mesa structures 14 together with the front contact 13 in a self-aligning manner. For this purpose, the front contact 13 is first applied over the n++-type doping and a subsequent etching step is carried out with the front contact 13, if necessary protected, as etching mask.

After producing the contacts, the passivation layer 15, which may be, for example, a grown-on oxide, can be applied.

The sequence and nature of the steps is, however, not critical for the production of a high-performance solar cell having an efficiency of at least 20% if the abovementioned boundary conditions are maintained. The form of the contacts on the front and rear sides is also of no importance if the total shading and reflection losses remain below 8%. Thus, both contacts may be formed as point contact or as grid contact and the rear contact may additionally be designed as a surface-wide electrode. In FIG. 10, the back contact 18 is designed as a printed-on and baked-in Al or Ag screen-printing paste over a passivation layer 19. It is also possible to produce a back-surface field in addition underneath the passivation layer 19 by driving in boron in order to prevent the minority charge carriers (electrons) from diffusing to the surface, where the recombination rate is increased because of the free dangling bonds.

A further advantage of the solar cells according to the invention manufactured from tricrystal wafers is their increased open-circuit voltage, which in turn increases the filling factor and consequently also the efficiency.

Consequently, higher-performance solar cells can be produced at substantially reduced costs using conventional and tried methods.

The invention is not limited to the particular details of the apparatus and method depicted and other modifications and applications are contemplated. Certain other changes may be made in the above described apparatus and method without departing from the true spirit and scope of the invention herein involved. It is intended, therefore, that the subject matter in the above depiction shall be interpreted as illustrative and not in a limiting sense.

What is claimed is:

1. A solar cell comprising: a mechanically robust 60 μm to 90 μm thick silicon semiconductor wafer as a solar cell substrate, said wafer having a front side and a rear side, and said wafer having three mutually inclined monocrystalline regions which form three circular sectors whose interfaces and boundary lines extend radially with respect to one another and form angles of less than 180° with one another, two of the interfaces being first-order twin grain boundaries between two <111> crystal planes in each case, the wafer being produced from crucible-drawn silicon;

a light p-doping in the wafer;

a shallow, n+-doped emitter 0.2 μm to 2 μm deep on the front side;

a first passivation layer on the front side, the first passivation layer being an oxide layer which produces a charge carrier recombination rate on the surface of said wafer of less than 1000 cm/s;

a second passivation layer or a back surface field on the rear side, the charge carrier recombination rate on the rear side being less than 100 cm/s; and current-collecting contacts respectively on the front and rear sides.

2. The solar cell as claimed in claim 1, wherein the solar cell has a conversion efficiency of at least 20 percent.

3. The solar cell as claimed in claim 1, wherein the interfaces are approximately perpendicular to the plane of the wafer and form angles W6, W7, and W8 with respect to one another, where:

$W7=W8=(360°-W6)/2$ and $W6=109.47°\pm2°$.

4. The solar cell as claimed in claim 1, wherein the surfaces of the three monocrystalline regions are <110> crystal planes.

5. The solar cell as claimed in claim 1, wherein the solar cell has a texturing on the front side in the form of cones etched into a surface of the wafer.

6. A process for producing a silicon semiconductor wafer for a solar cell substrate having three mutually inclined circular-sector-shaped monocrystalline regions, comprising the steps of:

producing three octahedral seed crystals by sawing the crystals out of a conventional <110>-oriented monocrystal such that all octahedral surfaces are identical with <111> crystal planes;

joining two of the seed crystals by laying the two seed crystals on top of one another and fixing the two seed crystals with a wire so that a first-order twin grain boundary is formed;

growing, utilizing the two joined seed crystals, a bicrystal using a crystal growing process;

sawing a wedge-shaped piece out of the bicrystal and in this process a <111> plane of the two half-crystals is laid bare in each case;

inserting the third seed crystal into the wedge-shaped gap such that a second first-order twin grain boundary is formed with the <111> crystal surface;

shortening the bicrystal to approximately a length of the third seed crystal to form a tricrystal seed;

pulling a tricrystal ingot from a silicon melt utilizing a crystal growing process using the tricrystal seed; and sawing the semiconductor wafer out of the tricrystal ingot using a wire saw.

7. The process as claimed in claim 6, wherein a molybdenum wire is used to fix the seed crystals.

8. The process as claimed in claim 6, wherein a Czochralski process is used for crystal growing.

9. The process as claimed in claim 6, wherein the tricrystal seed and the growing tricrystal ingot are aligned such that six mirror-like facets form on the tricrystal ingot.

10. The process as claimed in claim 6, wherein after pulling a first tricrystal ingot from a quartz melting crucible, the silicon melt which is not more than half consumed is topped up by adding fresh silicon and the entire process is repeated up to ten times.

11. The process as claimed in claim 10, wherein a sawn-off tip of a previously pulled tricrystal ingot is used as a seed crystal.

* * * * *